(12) United States Patent
Matsuo et al.

(10) Patent No.: US 6,802,034 B2
(45) Date of Patent: Oct. 5, 2004

(54) TEST PATTERN GENERATION CIRCUIT AND METHOD FOR USE WITH SELF-DIAGNOSTIC CIRCUIT

(75) Inventors: Yukikazu Matsuo, Hyogo (JP); Yoshihiro Nagura, Tokyo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 451 days.

(21) Appl. No.: 10/059,118

(22) Filed: Jan. 31, 2002

(65) Prior Publication Data
US 2003/0018938 A1 Jan. 23, 2003

(30) Foreign Application Priority Data
Jul. 17, 2001 (JP) .......................... 2001-216732

(51) Int. Cl.⁷ ................................ G06F 11/00
(52) U.S. Cl. ....................... 714/744; 714/798
(58) Field of Search ................ 714/738, 728, 714/739, 742, 744, 798, 814, 815, 32, 33; 713/600

(56) References Cited

U.S. PATENT DOCUMENTS

| | | | | |
|---|---|---|---|---|
| 4,788,684 A | * | 11/1988 | Kawaguchi et al. | 714/719 |
| 5,579,251 A | * | 11/1996 | Sato | 702/117 |
| 6,178,533 B1 | * | 1/2001 | Chang | 714/739 |
| 6,675,329 B1 | * | 1/2004 | Im | 714/718 |

FOREIGN PATENT DOCUMENTS

JP  4-320981  11/1992

* cited by examiner

Primary Examiner—Christine Tu
(74) Attorney, Agent, or Firm—McDermott Will & Emery LLP

(57) ABSTRACT

A test pattern generation circuit for use with a self-diagnostic circuit which produces a test pattern through use of a microinstruction code, which includes a memory device RAM/ROM which temporarily stores the microinstruction code and outputs two different instruction codes within one clock cycle; a selector SEL which receives output from the memory device and selectively delays the two instruction codes, thereby outputting one code; and a pattern generation circuit PG which produces a test pattern corresponding to output from the selector.

5 Claims, 3 Drawing Sheets

TEST PATTERN GENERATION CIRCUIT AND METHOD FOR USE WITH SELF-DIAGNOSTIC CIRCUIT

BACKGROUND OF THE INVENTION

1. Field of the Invention

The present invention relates to a pattern generation circuit, and more particularly, to a test pattern generation circuit and method for use with a self-diagnostic circuit (described hereinafter as a built-in self test circuit or "BIST" circuit) for generating a test pattern through use of a microinstruction code.

2. Background Art

FIG. 5 is a block diagram showing the configuration of a pattern generation circuit of a tester. In the drawing, RAM/ROM 1 is a first instruction code storage device for temporarily storing a microinstruction code and is constituted of RAM or ROM.

Reference symbol ADD 1 denotes an address signal to be supplied to the RAM/ROM 1; and CLK 1 denotes a clock signal. Reference symbol PG-1 denotes a pattern generation circuit which reads a microinstruction code INST.1 from the RAM/ROM 1 through use of the clock signal CLK 1 to thereby produce a test pattern DATA.1; RAM/ROM 2 denotes a second instruction code storage device which is identical in configuration and function with the RAM/ROM 1; ADD 2 denotes an address signal to be supplied to the RAM/ROM 2; and CLK 2 denotes a clock signal. Reference symbol PG-2 denotes a pattern generation circuit which reads a microinstruction code INST.2 from the RAM/ROM 2 through use of the clock signal CLK 2 to thereby produce a test pattern DATA. 2; and SEL denotes a selector which is connected to both the PG-1 and the PG-2 and selects either the test pattern DATA.1 or the test pattern DATA. 2.

FIG. 6 is a timing chart showing the correlation among the signals shown in FIG. 5. Referring to FIG. 6, reference symbols A0 through A3 denote address values of RAM/ROM, and Code.0 through Code.2 denote instruction codes for respective address values.

The circuit shown in FIG. 5 adopts a multi-bank interleaving method. According to the method, memory for temporarily storing a microinstruction code is divided into two banks; namely, the RAM/ROM 1 and the RAM/ROM 2. The memory for storing a continuous address signal ADD 1 and the memory for storing a continuous address signal ADD 2 are alternately assigned to the two banks. The circuit produces a test pattern a speed higher than a time required for accessing the RAM/ROM 1 and the RAM/ROM 2. For these reasons, as shown in FIG. 6, a clock signal CLK 1 to be sent to the RAM/ROM 1 differs in phase from a clock signal CLK 2 to be sent to the RAM/ROM 2. Memory cycles A0, A2, . . . corresponded to the continuous address signal ADD 1 and memory cycles A1, A3, . . . corresponded to the continuous address signal ADD 2 are arranged so as to overlap each other.

When a microinstruction code stored in the RAM/ROM 1 is read through use of the clock signal CLK 1, a code 0 and a code 2 are output from the RAM/ROM 1 with a phase indicated by INST.1 in FIG. 6. Similarly, when a microinstruction code stored in the RAM/ROM 2 is read through use of the clock signal CLK 2, a code 1 and a code 3 are output from the RAM/ROM 2 with a phase indicated by INST.2. Two different codes INST.1 and INST.2 are output within a single clock cycle. The code INST.1 is input to the pattern generation circuit PG-1, and a corresponding test pattern signal DATA.1 is output from the pattern generation circuit PG-1. The code INST.2 is input to the pattern generation circuit PG-2, and a corresponding test pattern signal DATA.2 is output from the pattern generation circuit PG-2.

These test pattern signals DATA.1 and DATA.2 are input to the selector SEL. The test pattern signals are selected alternately, and the thus-selected test pattern signals are sequentially output. As a result, outputs denoted by OUT in FIG. 6 are produced.

The pattern generation circuit of the tester has the foregoing configuration. A plurality of blocks which are constituted of RAM/ROM and pattern generation circuits PG are required, thereby resulting in an increase in the area occupied by the circuit.

For this reason, the pattern generation circuit cannot be adopted as a pattern generation circuit of a BIST circuit, because limitations are imposed on the area occupied by the BIST circuit. Hence, the present invention is aimed at providing a test pattern generation circuit and method for use with a BIST circuit, which circuit and method provide the same function within a smaller area.

SUMMARY OF THE INVENTION

According to one aspect of the present invention, the present invention provides a test pattern generation circuit for use with a self-diagnostic circuit which produces a test pattern through use of a microinstruction code.

In one embodiment of the present invention, the circuit preferably comprises a memory device which temporarily stores the microinstruction code and outputs two different instruction codes within one clock cycle; a selector which receives output from the memory device and selectively delays the two instruction codes, thereby outputting one code; and a pattern generation circuit which produces a test pattern corresponding to output from the selector.

The selector can perform a selective delaying operation through use of a high-speed clock signal which is twice as fast as a clock signal to be sent to the memory device.

In another embodiment of the present invention the circuit comprises a memory device which temporarily stores the microinstruction code and outputs N different instruction codes within one clock cycle; a selector which receives output from the memory device and selectively delays N instruction codes through use of a clock signal which is N times as fast as a clock signal to be sent to the memory device, thereby outputting one code; and a pattern generation circuit which produces a test pattern corresponding to output from the selector.

According to another aspect of the present invention, the present invention provides a test pattern generation method for use with a self-diagnostic circuit which produces a test pattern through use of a microinstruction code.

In one embodiment, the method comprises outputting within one clock cycle two different instruction codes from a memory device which temporarily stores the microinstruction codes; selectively delaying the instruction codes by use of a selector, thereby producing one code; and producing a test pattern corresponding to output from the selector by use of a pattern generation circuit.

The selector can perform a selective delaying operation through use of a high-speed clock signal which is twice as fast as a clock signal to be sent to the memory device.

In another embodiment, the method comprises outputting within one clock cycle N different instruction codes from a memory device which temporarily stores the microinstruction codes; selectively delaying the instruction codes by use of a selector to which is imparted a clock signal N times as fast as a clock signal to be sent to the memory device, thereby producing one code; and producing a test pattern corresponding to output from the selector by use of a pattern generation circuit.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

First Embodiment

Figure 1:
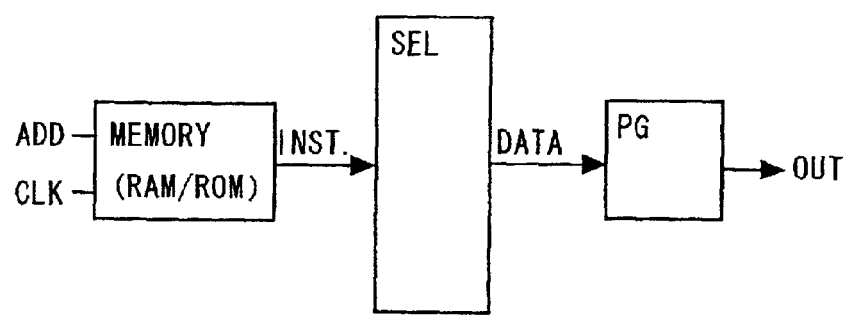
FIG. 1 is a block diagram showing the configuration of a first embodiment of the present invention and a test pattern generation method according to the first embodiment.

FIG. 1 is a block diagram showing the configuration of a first embodiment of the present invention and a test pattern generation method according to the first embodiment. As shown in the drawing, memory is an instruction code storage device for temporarily storing a microinstruction code and is constituted of RAM or ROM. Two different microinstruction codes are output corresponded to one address.

Reference symbol INST. denotes a signal output from the memory; ADD denotes an address signal to be supplied to the memory; and CLK denotes a clock signal.

Reference symbol SEL denotes a selector which receives an INST. signal output from the memory and outputs an instruction code as one code by means of selectively delaying two instruction codes; DATA denotes a microinstruction code selectively output from the selector SEL; and PG denotes a pattern generation circuit which receives output from the selector SEL and outputs a corresponding test pattern.

Figure 2:
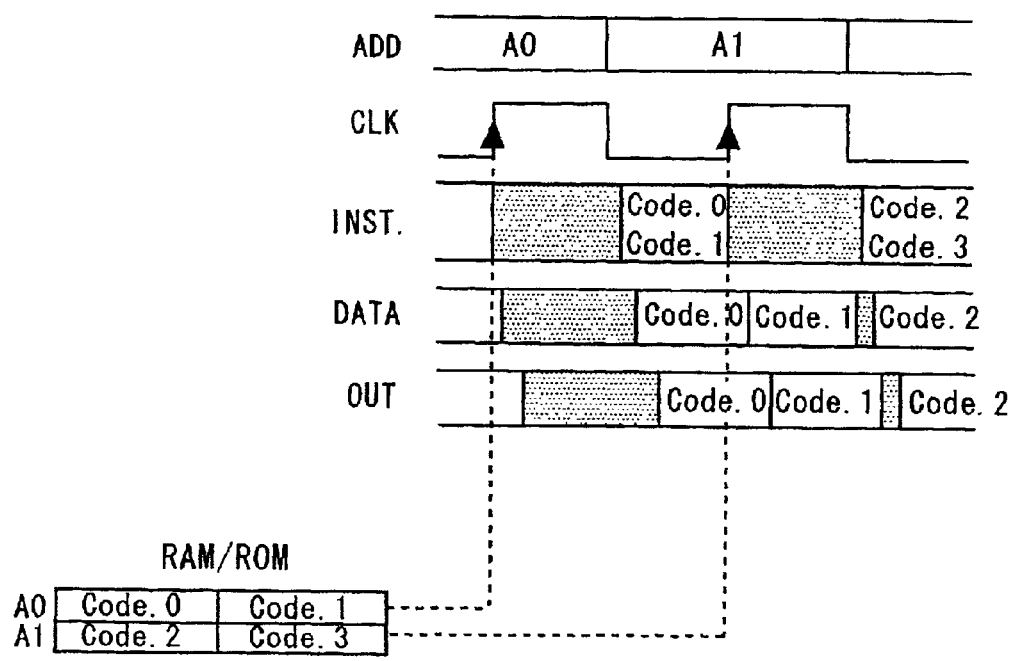
FIG. 2 is a timing chart showing the statuses of the signals shown in FIG. 1.

FIG. 2 is a timing chart showing the statuses of the signals shown in FIG. 1. Referring to FIG. 2, reference symbols A0 and A1 denote address values of memory; and Code.0 through Code.3 denote instruction codes at respective address values.

The memory temporarily stores a microinstruction code in a predetermined address A0, A1, . . . so as to correspond to the continuous address signal ADD. Further, in response to the clock signal CLK, the memory outputs two different codes (i.e., a code 0 and a code 1) within one clock cycle, as indicated by the signal INST. shown in FIG. 2.

These codes are input to the selector SEL within one clock cycle. The selector SEL selectively delays either of the two codes by an amount corresponding to the duration of one code. Simultaneously, the thus-received two microinstruction codes (i.e., a code 0 and a code 1) are output as one code, as indicated by DATA shown in FIG. 2.

The pattern generation circuit PG produces a test pattern corresponding to output from the selector SEL, and two different codes are processed within one clock cycle.

The first embodiment is constructed in the manner as mentioned above. Since one pattern generation circuit PG can process a plurality of instruction codes, the layout area of a BIST circuit can be made smaller, thus contributing to design for facilitating a test.

Second Embodiment

Figure 3:
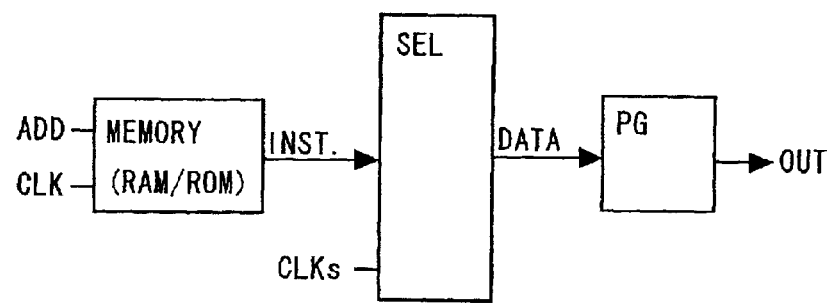
FIG. 3 is a block diagram showing the configuration of a second embodiment of the present invention and a test pattern generation method according to the second embodiment.

FIG. 3 is a block diagram showing the configuration of a second embodiment of the present invention and a test pattern generation method according to the second embodiment. The test pattern generation method shown in FIG. 2 differs from that shown in FIG. 1 in that the selector SEL is caused to perform a selective delay operation by use of a high-speed clock signal which is twice as fast as the clock signal sent to the memory. More specifically, reference symbol CLKs denotes a clock signal to be supplied to the selector SEL as a selective delay signal. The clock signal CLKs is a high-speed clock signal which is twice as fast as the clock signal to be supplied to the memory (hereinafter called a "high-speed clock doubler signal").

Figure 4:
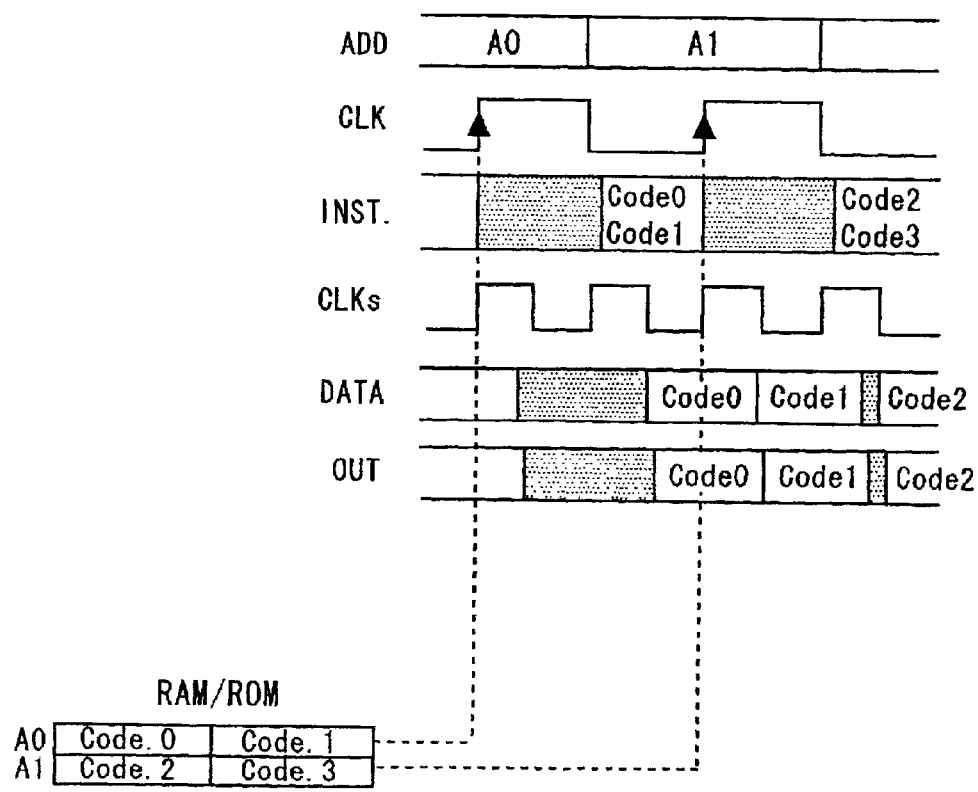
FIG. 4 is a timing chart showing the correlation among the signals shown in FIG. 3.
Figure 5:
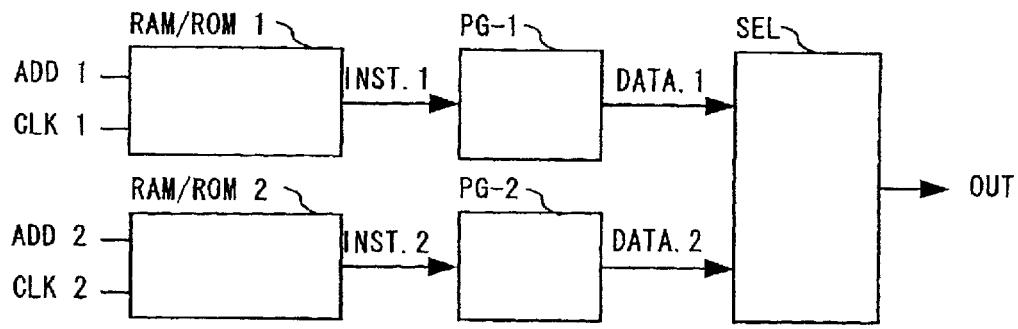
FIG. 5 is a block diagram showing the configuration of a pattern generation circuit of a tester.
Figure 6:
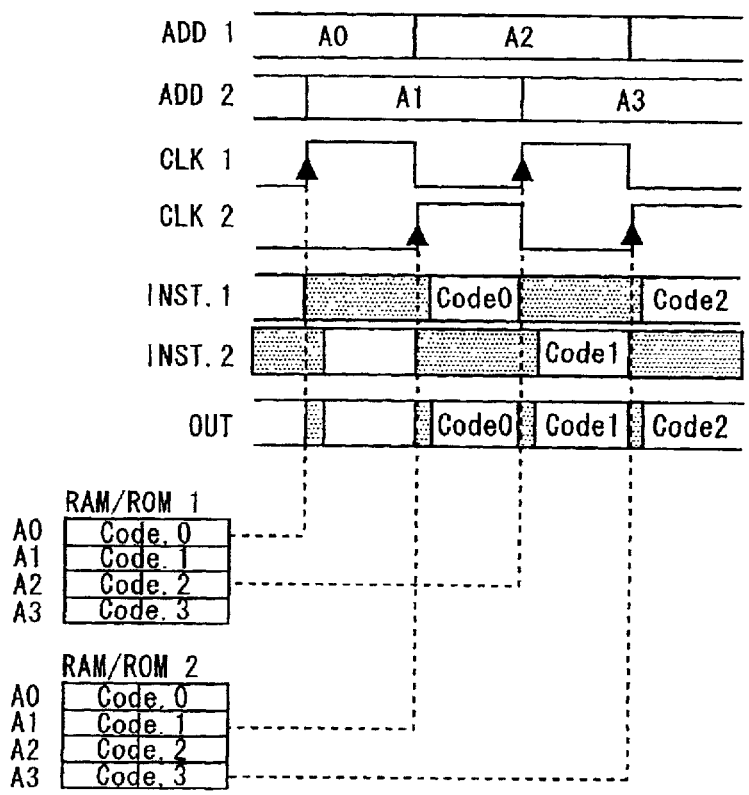
FIG. 6 is a timing chart showing the correlation among the signals shown in FIG. 5.

FIG. 4 is a timing chart showing the correlation among the signals shown in FIG. 3. The high-speed clock doubler signal CLKs is imparted to the selector SEL, and the selector SEL selectively delays a code by use of the high-speed clock doubler signal CLKs. As a result, the pattern generation circuit PG can produce a clock synchronous output, as designated by OUT shown in FIG. 4.

The output signal becomes delayed from the clock signal CLKs. FIG. 4 shows the signals including delays.

Third Embodiment

A third embodiment of the present invention will now be described. In the present embodiment, the memory employed in the second embodiment shown in FIG. 3 outputs N different instruction signals within one clock cycle. The memory sends to the selector SEL a clock signal which is N times as fast as the clock signal to be sent to the memory. N microinstruction codes simultaneously loaded from the memory within one clock cycle are selectively delayed by an amount corresponding to the duration of one code. As a result, the microinstruction codes are output as one code. As in the case of the second embodiment, the pattern generation circuit PG processes N different codes and produces corresponding test patterns.

By means of adoption of such a configuration and the processing method, there can be implemented an operation which is N times as fast as the clock signal to be sent to the memory.

It is further understood that the foregoing description is a preferred embodiment of the disclosed apparatus and that various changes and modifications may be made in the invention without departing from the spirit and scope thereof.

The entire disclosure of a Japanese Patent Application No. 2001-216732, filed on Jul. 17,2001 including specification, claims drawings and summary, on which the Convention priority of the present application is based, are incorporated herein by reference in its entirety.

What is claimed is:

1. A test pattern generation circuit for use with a self-diagnostic circuit which produces a test pattern through use of a microinstruction code, comprising:

a memory device which temporarily stores the microinstruction code and outputs two different instruction codes within one clock cycle;

a selector which receives output from the memory device and selectively delays the two instruction codes, thereby outputting one code; and a pattern generation circuit which produces a test pattern corresponding to output from the selector.

2. The test pattern generation circuit according to claim 1, wherein the selector performs a selective delaying operation through use of a high-speed clock signal which is twice as fast as a clock signal to be sent to the memory device.

3. A test pattern generation circuit for use with a self-diagnostic circuit which produces a test pattern through use of a microinstruction code, comprising:

a memory device which temporarily stores the microinstruction code and outputs N different instruction codes within one clock cycle;

a selector which receives output from the memory device and selectively delays N instruction codes through use of a clock signal which is N times as fast as a clock signal to be sent to the memory device, thereby outputting one code; and a pattern generation circuit which produces a test pattern corresponding to output from the selector.

4. A test pattern generation method for use with a self-diagnostic circuit which produces a test pattern through use of a microinstruction code, comprising the steps of:

outputting within one clock cycle two different instruction codes from a memory device which temporarily stores the microinstruction codes;

selectively delaying the instruction codes by use of a selector, thereby producing one code; and producing a test pattern corresponding to output from the selector by use of a pattern generation circuit.

5. The test pattern generation method according to claim 4, wherein the selector performs a selective delaying operation through use of a high-speed clock signal which is twice as fast as a clock signal to be sent to the memory device.

\* \* \* \* \*